United States Patent
Fujii et al.

(10) Patent No.: US 8,548,021 B2
(45) Date of Patent: Oct. 1, 2013

(54) III-NITRIDE SEMICONDUCTOR LASER, AND METHOD FOR FABRICATING III-NITRIDE SEMICONDUCTOR LASER

(75) Inventors: Kei Fujii, Itami (JP); Masaki Ueno, Itami (JP); Katsushi Akita, Itami (JP); Takashi Kyono, Itami (JP); Yusuke Yoshizumi, Itami (JP); Takamichi Sumitomo, Itami (JP); Yohei Enya, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 16 days.

(21) Appl. No.: 13/211,858

(22) Filed: Aug. 17, 2011

(65) Prior Publication Data

US 2012/0008660 A1    Jan. 12, 2012

Related U.S. Application Data

(63) Continuation of application No. PCT/JP2009/071661, filed on Dec. 25, 2009.

(30) Foreign Application Priority Data

Feb. 17, 2009  (JP) ................. P2009-034004

(51) Int. Cl.
*H01S 5/00*    (2006.01)

(52) U.S. Cl.
USPC ....... 372/44.011; 257/E33.043; 257/E33.033; 257/E33.003

(58) Field of Classification Search
USPC ............. 372/44.011; 257/E33.043, E33.033, 257/E33.003
See application file for complete search history.

(56) References Cited

U.S. PATENT DOCUMENTS

| | | | |
|---|---|---|---|
| 2005/0224783 A1* | 10/2005 | Matsuyama et al. | 257/14 |
| 2006/0126688 A1* | 6/2006 | Kneissl | 372/43.01 |
| 2008/0191223 A1* | 8/2008 | Nakamura et al. | 257/95 |

FOREIGN PATENT DOCUMENTS

| | | |
|---|---|---|
| JP | 08-056046 A2 | 2/1996 |
| JP | 2005-072368 | 3/2005 |

(Continued)

OTHER PUBLICATIONS

Ponce et al., "Lattice Mismatch and Misfit Disclocation in Hexagonal GaN-Based Heterostructures for Solid State Lighting Applications," 2007, Acta Microscopia, vol. 16, p. 8-9.*

(Continued)

*Primary Examiner* — Jessica Stultz
*Assistant Examiner* — Joshua King
(74) *Attorney, Agent, or Firm* — Venable LLP; Michael A. Sartori; Steven J. Schwarz

(57) ABSTRACT

Provided is a III-nitride semiconductor laser allowing for provision of a low threshold with use of a semipolar plane. A primary surface 13a of a semiconductor substrate 13 is inclined at an angle of inclination $A_{OFF}$ in the range of not less than 50 degrees and not more than 70 degrees toward the a-axis direction of GaN with respect to a reference plane perpendicular to a reference axis Cx along the c-axis direction of GaN. A first cladding layer 15, an active layer 17, and a second cladding layer 19 are provided on the primary surface 13a of the semiconductor substrate 13. The well layers 23a of the active layer 17 comprise InGaN. A polarization degree P in the LED mode of emission from the active layer of the semiconductor laser that reaches lasing is not less than −1 and not more than 0.1. The polarization degree P of the III-nitride semiconductor laser is defined by P=(I1−I2)/(I1+I2), using an electric field component I1 in the X1 direction and an electric field component I2 in the X2 direction of light in the LED mode.

19 Claims, 11 Drawing Sheets

(56) References Cited

FOREIGN PATENT DOCUMENTS

| JP | 2008-066717 | A2 | 3/2008 |
|----|-------------|----|--------|
| JP | 2009-016684 | A2 | 1/2009 |
| JP | 2009-021346 |    | 1/2009 |
| JP | 2009-071127 | A2 | 4/2009 |
| WO | WO-2008/100504 | A1 | 8/2008 |

OTHER PUBLICATIONS

Scheinbenzuber et al., "Calculation of Optical Eigenmodes and Gain in Semipolar and Nonpolar InGaN/GaN Laser Diodes," Sep. 21, 2009, Phys. Rev. B, 80, 115320, 16.*

Yamaguchi, "Anisotropic Optical Matrix Elements in Strained GaN-Quantum Wells with Various Substrate Orientations", Mar. 25, 2008, Phys. Stat. Sol. (c), 5, No. 6, 2329-2332.*

Kojima et al., "Stimulated Emission at 474 nm From an InGaN Laser Diode Structure Grown on a (11-22) GaN Substrate," Applied Physics Letters, 91, pp. 251107-1-251107-3 (2007).

Okamoto et al., "Continuous Wave Operation of *m*-Plane InGaN Multiple Quantum Well Laser Diodes," Japanese Journal of Applied Physics, vol. 46, No. 9, pp. L187-L189 (2007).

Yamaguchi, A. "Anisotropic Optical Matrix Elements in Strained GaN Quantum Wells on Semipolar and Nonpolar Substrates," Japanese Journal of Applied Physics, vol. 46, No. 33, pp. L789-L791 (2007).

Interrogatory in Japanese Patent Application No. 2011-260646 dated Mar. 19, 2013.

\* cited by examiner

Fig.5
(a)
43° off m-axis (P=0.52)
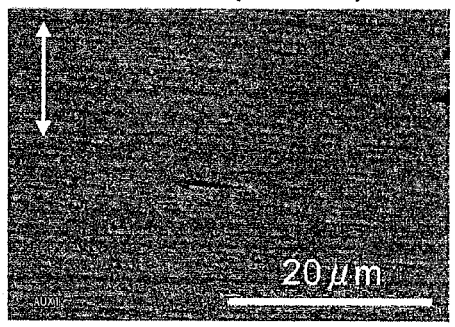
(b)
58° off a-axis (P=-0.29)
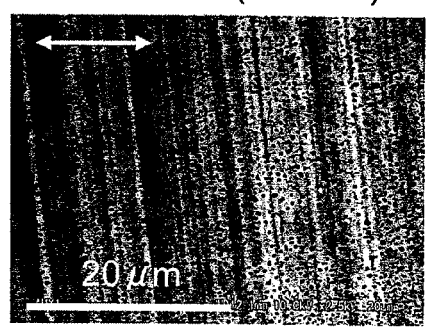
(c)
62° off m-axis (P=-0.06)
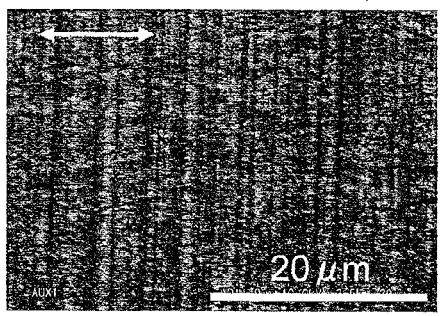
(d)
75° off m-axis (P=0.24)
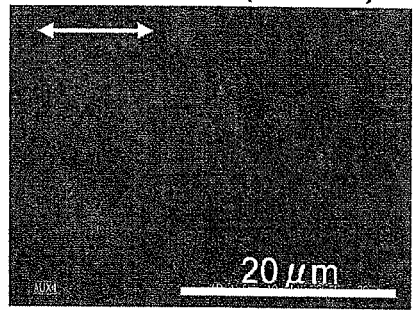

Fig.11
(a)
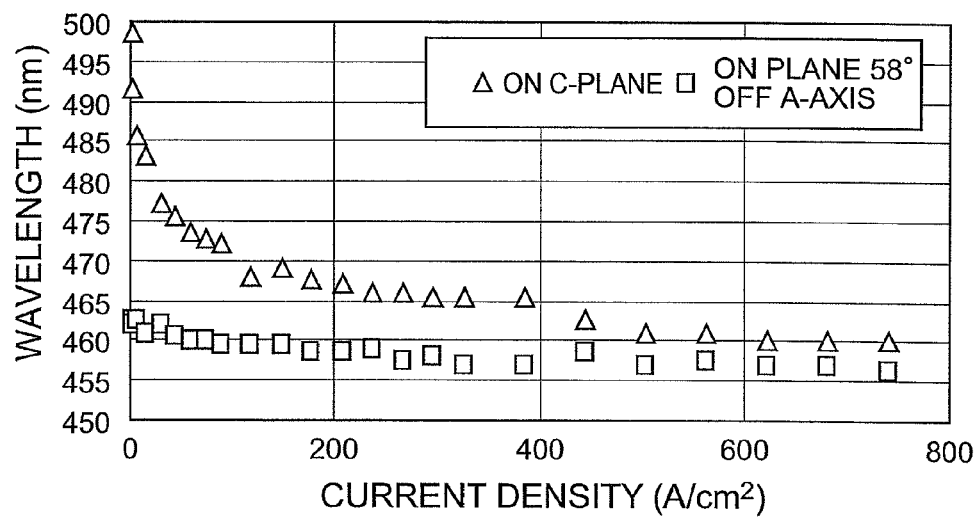
(b)
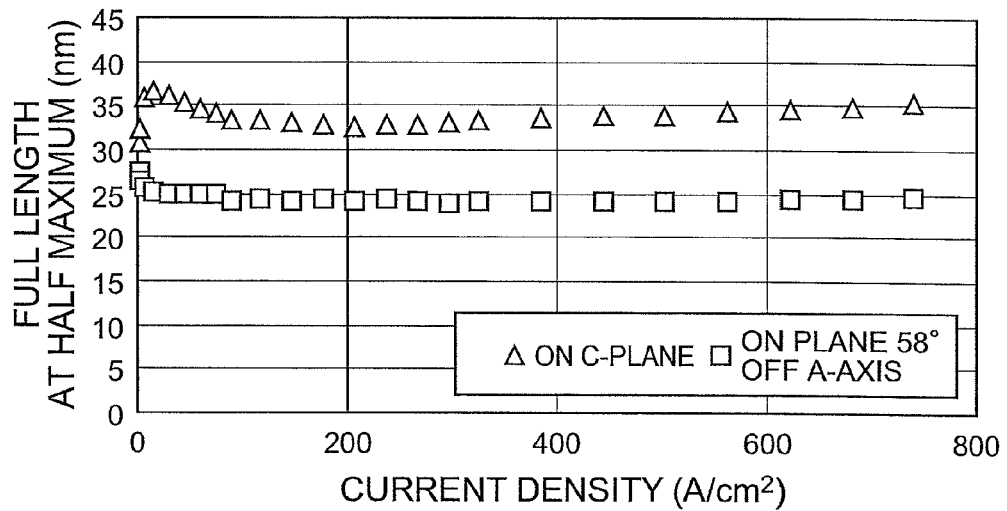

III-NITRIDE SEMICONDUCTOR LASER, AND METHOD FOR FABRICATING III-NITRIDE SEMICONDUCTOR LASER

CROSS REFERENCE TO RELATED APPLICATIONS

This is a continuation of a application PCT application No. PCT/JP2009/071661 filed on Dec. 25, 2009, claiming the benefit of priority from Japanese Patent application No. 2009-034004 filed on Feb. 17, 2009, and incorporated by reference in their entirety.

TECHNICAL FIELD

The present invention relates to a III-nitride semiconductor laser, and a method for fabricating the III-nitride semiconductor laser.

BACKGROUND ART

Non-patent Document 1 shows an InGaN/GaN quantum well structure made on a GaN (11-22) substrate. An off angle of the GaN substrate is 58 degrees formed in the a-axis direction. Since a cavity structure cannot be formed with the above-described crystal facets, the quantum well structure is made to emit light by photo-pumping. Pumping light is guided in a direction along a plane defined by the c-axis and a-axis. This quantum well structure is disposed between GaN optical guide layers. An emission measured along the [-1-123] direction is generated with a lower energy and a lower threshold pumping power than an emission measured along the [1-100] direction.

Non-patent Document 2 discloses laser diodes made on an m-plane. The laser diodes have the InGaN/GaN quantum well structure and the lasing wavelength thereof is 400 nm. This quantum well structure is disposed between GaN guide layers. Stripes parallel to the a- and c-axes show TE mode operation, and the c-axis stripe laser diode among such laser diodes exhibits the lower threshold current densities. Non-patent Document 3 shows theoretical calculation of polarization degree.

PRIOR ART DOCUMENTS

Non-patent Documents

Non-patent Document 1: Applied Physics Letters, vol. 91, pp. 251197
Non-patent Document 2: Japanese Journal of Applied Physics, vol. 46, No. 9, 2007, pp. L187-L189
Non-patent Document 3: Japanese Journal of Applied Physics, vol. 46, No. 33, 2007, pp. L789-L791

SUMMARY OF THE INVENTION

Problem to be Solved by the Invention

A semiconductor laser is made on a c-plane GaN wafer. Fabrication of a semiconductor laser on a nonpolar plane (a-plane or m-plane) GaN wafer is under research because the piezoelectric field can be made substantially zero. Furthermore, attention is drawn to fabrication of a semiconductor laser on a semipolar GaN wafer, though influence of the piezoelectric field remains.

Unlike the semiconductor lasers using the c-plane GaN wafer, the semiconductor lasers using the nonpolar and semipolar planes demonstrate optical anisotropy, and an orientation of cleaved edges is important for obtaining a low-threshold semiconductor laser. Since the semiconductor laser on the m-plane GaN substrate shows polarization in the a-axis direction as described in Non-patent Document 2, cleavage formed along the c-plane allows a component with a high transition probability to lase as TE mode. However, when the laser structure in Non-patent Document 2 is applied to a semipolar plane inclined from a nonpolar plane, cleaved c-planes are inclined relative to the waveguide direction, thus failing to obtain a cavity. On the other hand, the polarization degrees in Non-patent Documents 1 and 2 are about 0.7 or higher.

In III-nitride semiconductor lasers, the polarization degree is associated with the threshold current. According to the inventors' knowledge, it is considered that the threshold current of the III-nitride semiconductor laser becomes low when the polarization degree is a negative value or a value close to zero.

It is an object of the present invention to provide a III-nitride semiconductor laser realizing provision of a low threshold with use of a semipolar plane, and it is another object of the present invention to provide a method for fabricating the III-nitride semiconductor laser.

Means for Solving the Problem

One aspect of the present invention is a III-nitride semiconductor laser. This III-nitride semiconductor laser comprises: (a) a semiconductor substrate comprising a hexagonal III-nitride semiconductor, the semiconductor substrate having a primary surface, the primary surface being inclined at an angle of inclination in a range of not less than 50 degrees and not more than 70 degrees toward either one of an a-axis direction and an m-axis direction of the III-nitride semiconductor with respect to a reference plane perpendicular to a reference axis, and the reference axis extending along a c-axis direction of the III-nitride semiconductor; (b) a first cladding layer provided on the primary surface of the semiconductor substrate, the first cladding layer comprising a first conductivity type gallium nitride-based semiconductor; (c) a second cladding layer provided on the primary surface of the semiconductor substrate, the second cladding layer comprising a second conductivity type gallium nitride-based semiconductor; and (d) an active layer provided between the first cladding layer and the second cladding layer. A waveguide direction in the active layer is directed along another of the a-axis direction and the m-axis direction; in an orthogonal coordinate system having an X1 axis directed along the waveguide direction, an X2 axis perpendicular to the X1 axis and an X3 axis perpendicular to the X1 axis and the X2 axis, the first cladding layer, the active layer, and the second cladding layer are arranged in a direction of the X3 axis; the active layer has a multiple quantum well structure comprising well layers and barrier layers that are arranged alternately in the direction of the X3 axis, and the well layers comprises InGaN, and the barrier layers comprises one of GaN and InGaN; the multiple quantum well structure is provided such that at least either of a thickness of the well layers and a bandgap energy difference between the well layers and the barrier layers enables a polarization degree P in an LED mode of the III-nitride semiconductor laser to fall within a range of not less than −1 and not more than 0.1; and the polarization degree P is defined as follows:

$$P=(I1-I2)/(I1+I2),$$

where I1 indicates an electric field component in the X1 direction and I2 indicates an electric field component in the X2 direction of light in the LED mode.

This III-nitride semiconductor laser is based on knowing that the emission of the optical device using the c-plane exhibits random polarization whereas the emission of the optical device using a plane inclined from the c-plane shows optical anisotropy and, with this inclined plane in the foregoing angular range of not less than 50 degrees and not more than 70 degrees, the polarization degree of light in the LED mode of the semiconductor laser can be made as small as a value close to zero, or a negative value. In this embodiment, the polarization component of light directed to the th mode of the semiconductor laser can be made larger than the others, and thus the threshold of the semiconductor laser can be lowered. Namely, in the multiple quantum well structure on the semipolar plane, making the action of quantum confinement greater than the action of compressive strain enables the polarization degree in the LED mode to become smaller, resulting in that the polarization degree in the LED mode can be made as small as the value close to zero or the negative value.

In the III-nitride semiconductor laser according to the present invention, a lasing wavelength of the multiple quantum well structure of the active layer can be not less than 450 nm and not more than 550 nm.

In this III-nitride semiconductor laser, the polarization degree has wavelength dependence and in the foregoing wavelength range, the polarization degree can fall within the range of $-1 \leq P \leq 0.1$.

In the III-nitride semiconductor laser according to the present invention, a thickness of the well layer can be not less than 2 nm and not more than 10 nm.

In this III-nitride semiconductor laser, using the narrow well width facilitates realization of the polarization degree that is close to zero or the negative polarization degree. On the other hand, in the aforementioned angular range of inclination, the polarization degree can be realized in the range of $-1 \leq P \leq 0.1$, using the well layers in the thickness of not less than 2 nm and not more than 10 nm.

In the III-nitride semiconductor laser according to the present invention, a direction of the inclination is a direction of the a-axis. The III-nitride semiconductor laser can further comprise a pair of end faces comprising m-cleaved faces of the hexagonal III-nitride.

With this III-nitride semiconductor laser, a cavity of the III-nitride semiconductor laser can be constructed using the m-cleaved faces.

In the III-nitride semiconductor laser according to the present invention, the primary surface of the semiconductor substrate is, for example, either one of the (11-22) plane and the (11-2-2) plane. This III-nitride semiconductor laser allows for inclination in the direction from the c-axis to the a-axis.

In the III-nitride semiconductor laser according to the present invention, a direction of the inclination is a direction of the m-axis. The III-nitride semiconductor laser can further comprise a pair of end faces comprising a-cleaved faces of the hexagonal III-nitride.

With this III-nitride semiconductor laser, a cavity of the III-nitride semiconductor laser can be constructed using the a-cleaved faces.

In the III-nitride semiconductor laser according to the present invention, the primary surface of the semiconductor substrate is either one of the (10-11) plane and the (10-1-1) plane. This III-nitride semiconductor laser allows for inclination in the direction from to the m-axis.

In the III-nitride semiconductor laser according to the present invention, the semiconductor substrate comprises GaN. With this III-nitride semiconductor laser, it is feasible to obtain an epitaxial film with excellent crystal quality, and it is also possible to fabricate an off-angled GaN wafer.

The III-nitride semiconductor laser according to the present invention can further comprise an InGaN layer provided between the first cladding layer and the active layer.

In this III-nitride semiconductor laser, the InGaN layer acts as a buffer which can control stress on the active layer.

In the III-nitride semiconductor laser according to the present invention, an interface between the first cladding layer and the InGaN layer contains misfit dislocations.

With this III-nitride semiconductor laser, the relaxation of the InGaN layer through the misfit dislocations causes variation in anisotropy of strain. This variation in strain can be utilized for realizing the polarization degree in the range of $-1 \leq P \leq 0.1$. The misfit dislocations are considered to be introduced such that the c-plane of the InGaN layer acts as a slip plane. The misfit dislocations are introduced by use of the semiconductor substrate.

In the III-nitride semiconductor laser according to the present invention, an indium composition of the InGaN layer is not less than 0.01, the indium composition of the InGaN layer is not more than 0.1, the InGaN layer is in contact with a primary surface of the first cladding layer, and a lattice constant of the first cladding layer is different from that of the InGaN layer.

In this III-nitride semiconductor laser, a certain level of In composition is needed for introduction of misfit dislocations. On the other hand, a too high In composition could lead to reduction in crystal quality of the active layer.

In the III-nitride semiconductor laser according to the present invention, a thickness of the InGaN layer is not less than 20 nm and the thickness of the InGaN layer is not more than 150 nm.

In this III-nitride semiconductor laser, a certain level of film thickness is needed for introduction of misfit dislocations. On the other hand, a too large film thickness could lead to reduction in crystal quality of the active layer.

In the III-nitride semiconductor laser according to the present invention, the InGaN layer is a first optical guide layer, and the III-nitride semiconductor laser can further comprise a second optical guide layer provided between the second cladding layer and the active layer. The second optical guide layer comprises InGaN.

With this III-nitride semiconductor laser, the first and second optical guide layers comprising make it feasible to shape a beam pattern of the laser and to implement introduction of misfit dislocations.

In the III-nitride semiconductor laser according to the present invention, the polarization degree P has a negative value. This III-nitride semiconductor laser allows for realization of a low threshold.

In the III-nitride semiconductor laser according to the present invention, the angle of inclination is not less than 58 degrees and not more than 62 degrees. In this III-nitride semiconductor laser, the polarization degree P has a negative value in this angular range.

Another aspect of the present invention is a method for fabricating a III-nitride semiconductor laser. This method comprises the steps of: (a) preparing a semiconductor wafer, the semiconductor wafer comprising a hexagonal III-nitride semiconductor and having a primary surface, the primary surface being inclined at an angle of inclination in a range of not less than 50 degrees and not more than 70 degrees toward either one of an a-axis direction and an m-axis direction of the hexagonal III-nitride semiconductor with respect to a reference plane perpendicular to a reference axis, and the reference axis extending along the c-axis direction of the III-nitride semiconductor; (b) growing a first cladding layer of a first conductivity type gallium nitride-based semiconductor on the primary surface of the semiconductor wafer; (c) growing an active layer on the InGaN layer; and (d) growing a second cladding layer of a second conductivity type gallium nitride-based semiconductor on the active layer. A waveguide direction in the active layer is directed along either one of the a-axis direction and the m-axis direction; in an orthogonal coordinate system having an X1 axis directed along the waveguide direction, an X2 axis perpendicular to the X1 axis and an X3 axis perpendicular to the X1 axis and the X2 axis, the n-type gallium nitride-based semiconductor region, the active layer and the p-type gallium nitride-based semiconductor region are arranged in a direction of the X3 axis; the active layer has a multiple quantum well structure comprising well layers and barrier layers, the well layers and barrier layers are arranged alternately in the direction of the X3 axis, the well layers comprises InGaN, and the barrier layers comprises GaN or InGaN; the multiple quantum well structure is provided such that at least either of a thickness of the well layers and a bandgap energy difference between the well layers and the barrier layers enables a polarization degree P in the LED mode of the III-nitride semiconductor laser to fall within a range of not less than −1 and not more than 0.1; and the polarization degree P being defined as follows:

$$P=(I1-I2)/(I1+I2),$$

where I1 indicates an electric field component in the X1 direction and I2 indicates an electric field component in the X2 direction of light in the LED mode.

This method is based on knowing that the emission of the optical device using the c-plane exhibits random polarization whereas the emission of the optical device using the plane inclined from the c-plane shows optical anisotropy and, with the inclined plane in the foregoing angular range of not less than 50 degrees and not more than 70 degrees, the polarization degree of light in the LED mode of the semiconductor laser can be made as small as a value close to zero, or a negative value. In this embodiment, the polarization component of light directed to the TE mode of the semiconductor laser can be made larger and thus the threshold of the semiconductor laser can be lowered. Namely, in the multiple quantum well structure on the semipolar plane, making the action of quantum confinement greater than the action of compressive strain enables the polarization degree in the LED mode to become smaller, resulting in that the polarization degree in the LED mode can be made as small as the value close to zero or the negative value.

The method according to the present invention can further comprise the step of growing an InGaN layer on the first cladding layer, prior to the growth of the active layer. According to this method, the InGaN layer acts as a buffer layer which can control stress on the active layer.

In the method according to the present invention, an indium composition of the InGaN layer can be not less than 0.01 and the indium composition of the InGaN layer can be not more than 0.1. The InGaN layer is in contact with a primary surface of the first cladding layer, and a lattice constant of the first cladding layer is different from that of the InGaN layer.

In this method, a certain level of In composition is needed for introduction of misfit dislocations, whereas a too high In composition could lead to reduction in crystal quality of the active layer.

In the method according to the present invention, a thickness of the InGaN layer is not less than 20 nm and the thickness of the InGaN layer is not more than 150 nm.

In this method, a certain level of film thickness is needed for introduction of misfit dislocations, whereas a too large film thickness could lead to reduction in crystal quality of the active layer.

In the method according to the present invention, misfit dislocations are formed at an interface between the first cladding layer and the InGaN layer and a density of the misfit dislocations can be not less than $5\times10^3$ cm$^{-1}$ and not more than $1\times10^5$ cm$^{-1}$.

The above objects and the other objects, features, and advantages of the present invention can more readily become clear in view of the following detailed description of the preferred embodiments of the present invention proceeding with reference to the accompanying drawings.

Effect of the Invention

As described above, the present invention provides the III-nitride semiconductor laser realizing provision of the low threshold using the semipolar plane. The present invention also provides the method for fabricating the III-nitride semiconductor laser.

BRIEF DESCRIPTION OF THE DRAWINGS

FIG. 5 is a drawing showing cathodoluminescence images of LED structures.

FIG. 11 is a drawing showing characteristics of semiconductor lasers $D_M$ and $D_C$.

MODES FOR CARRYING OUT THE INVENTION

The expertise of the present invention can be readily understood in view of the following detailed description with reference to the accompanying drawings provided by way of illustration only. The following will describe embodiments of the III-nitride semiconductor laser, epitaxial wafer, and method for fabricating the epitaxial wafer and the III-nitride semiconductor laser according to the present invention, with reference to the accompanying drawings. The same portions will be denoted by the same reference symbols as much as possible.

Figure 1:
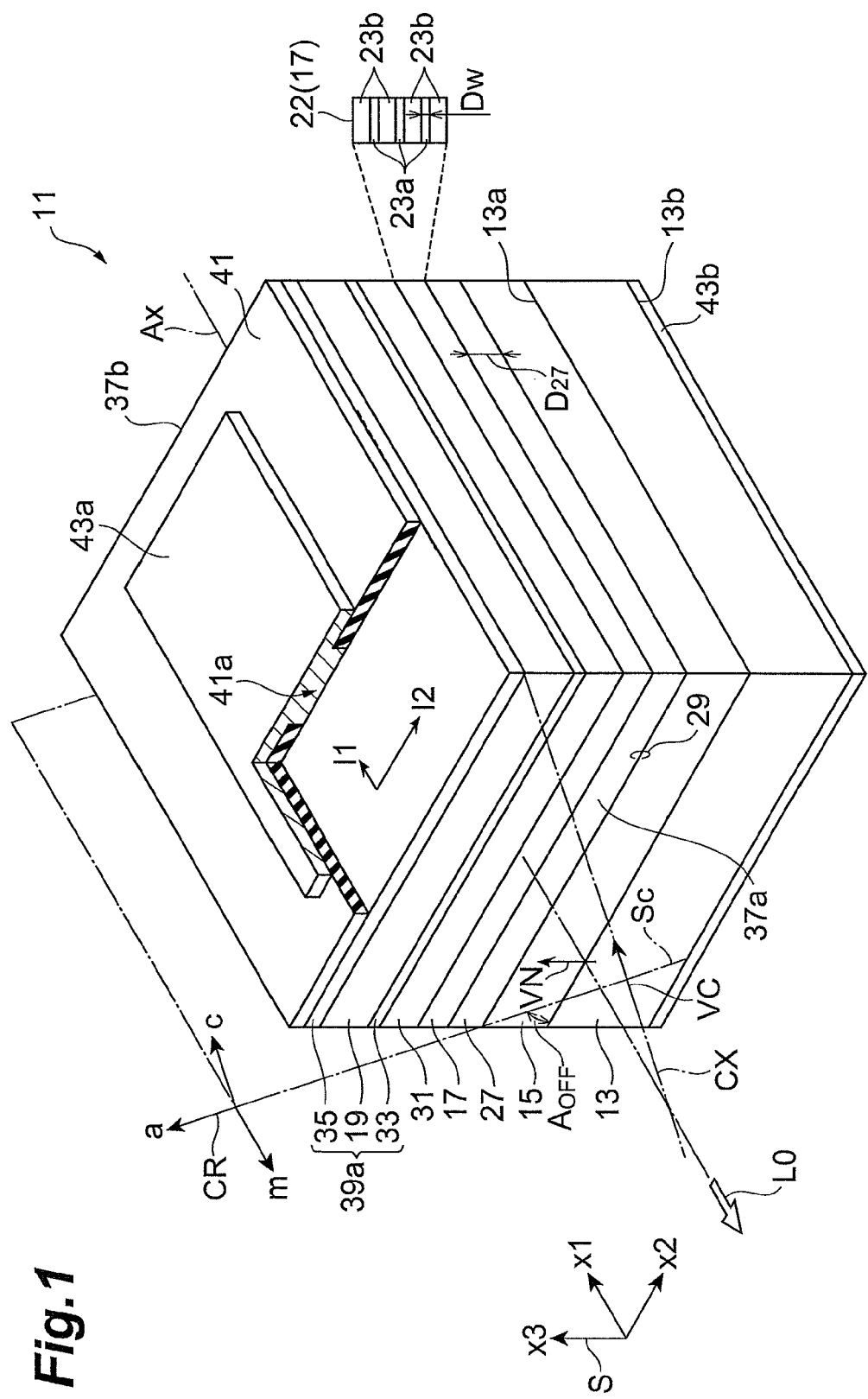
FIG. 1 is a drawing schematically showing a III-nitride semiconductor laser according to an embodiment of the present invention.

FIG. 1 is a drawing schematically showing a III-nitride semiconductor laser according to the present embodiment. Shown in FIG. 1 is an orthogonal coordinate system S having X1 axis, X2 axis, and X3 axis, and a crystal coordinate system CR for showing the a-axis, m-axis, and c-axis directions. The description below will follow such a notation that, for example, a plane opposite to the (0001) plane of a GaN-based semiconductor is represented by (000-1) plane.

The III-nitride semiconductor laser 11 has a semiconductor substrate 13, a first cladding layer 15, an active layer 17, and a second cladding layer 19. The semiconductor substrate 13 has a primary surface 13a and a back surface 13b. The semiconductor substrate 13 comprises a III-nitride semiconductor of a hexagonal system, and this III-nitride semiconductor is, for example, GaN or the like. The primary surface 13a of the semiconductor substrate 13 is inclined at an angle of inclination $A_{OFF}$ in the range of not less than 50 degrees and not more than 70 degrees toward respect to either one of the a-axis direction and the m-axis direction of the III-nitride semiconductor with respect to a reference plane perpendicular to the reference axis Cx that extends along the c-axis direction of the III-nitride semiconductor. This angle $A_{OFF}$ is equal to the complement of an angle between vector VC and vector VN in the present embodiment. Also shown in FIG. 1 are a typical c-plane $S_C$ and the c-axis vector VC, and normal vector VN to the primary surface 13a is shown therein. The first cladding layer 15 is provided on the primary surface 13a of the semiconductor substrate 13, and comprises a first conductivity type GaN-based semiconductor.

The GaN-based semiconductor of the first cladding layer 15 comprises, for example, GaN, AlGaN, InAlGaN, or the like. The waveguide direction of light in the active layer 17 is the other of the a-axis direction and the m-axis direction, and in FIG. 1, the axis Ax indicates the waveguide direction. The guided light becomes a laser beam L0 emitted from an end face. The second cladding layer 19 is provided above the primary surface 13a of the semiconductor substrate 13, and comprises a second conductivity type GaN-based semiconductor. The GaN-based semiconductor of the second cladding layer 19 comprises, for example, GaN, AlGaN, InAlGaN, or the like. The active layer 17 is provided between the first cladding layer 15 and the second cladding layer 19. The active layer 17 has a multiple quantum well structure 22. The multiple quantum well structure 22 includes well layers 23a and barrier layers 23b arranged alternately in the direction of the X3 axis, the well layers 23a comprise InGaN, and the barrier layers 23b comprise GaN or InGaN. In the present embodiment, the III-nitride semiconductor laser 11 is categorized into a gain guiding type having the waveguide direction along the direction of the X1 axis (m-axis direction in FIG. 1). In the III-nitride semiconductor laser 11, the n-type GaN-based semiconductor region, active layer, and p-type GaN-based semiconductor region are arranged in the direction of the X3 axis on the semiconductor substrate 13. The multiple quantum well structure is provided so that at least either of a bandgap energy difference between the well layers 23a and the barrier layers 23b and the thickness $D_w$ of the well layers 23 enables the polarization degree P in the LED mode of the III-nitride semiconductor laser to fall within the range of not less than −1 and not more than 0.1. Light in the LED mode of the III-nitride semiconductor laser is emitted from the active layer before the semiconductor laser reaches lasing. The polarization degree P is defined as follows:

$$P=(I1-I2)/(I1+I2),$$

using an electric field component I1 in the X1 direction and an electric field component I2 in the X2 direction of the light in this LED mode.

This III-nitride semiconductor laser 11 is based on knowing that the emission using the c-plane exhibits random polarization whereas the emission with the plane inclined from the c-plane exhibits optical anisotropy and, by use of the GaN inclined surface in the foregoing angular range of not less than 50 degrees and not more than 70 degrees (i.e., a semipolar plane), the polarization degree P of the light in the LED mode of the semiconductor laser 11 can be made as small as a value close to zero, or a negative value. At this time, it is feasible to make the polarization optical component of the TE mode large in the semiconductor laser 11 and thus to reduce the threshold of the semiconductor laser 11. Namely, in the multiple quantum well structure 22 on the semipolar plane, the polarization degree in the LED mode can be reduced to a small value and eventually to a negative value. Concerning the polarization degree, it increases toward "1" in multiple quantum well structures with strong compressive strain. On the other hand, the polarization degree P in the aforementioned range (not less than −1 and not more than 0.1) according to the present embodiment is considered to be provided by the action of quantum confinement, rather than by the action of compressive strain. In order to relatively enhance quantum confinement, it is preferable, for example, to increase the bandgap energy difference between the well layers and the barrier layers or to decrease the thickness of the well layers. An increase in the In composition of the InGaN well layers to obtain a long-wavelength emission enables enhancement of quantum confinement.

In the III-nitride semiconductor laser 11, the lasing wavelength of the multiple quantum well structure 22 is not less than 450 nm. The lasing wavelength can be not more than 550 nm. The polarization degree P shows wavelength dependence, and in the foregoing wavelength range, the polarization degree P can be realized in the range of $-1 \leq P \leq 0.1$. In the multiple quantum well structure 22, the thickness $D_W$ of the well layer 23a can be not less than 2 nm. The thickness $D_W$ can be not more than 10 nm. The narrow well width facilitates provision of the polarization degree close to zero or the negative polarization degree. On the other hand, in the aforementioned range of the inclination angle, the polarization degree can be realized in the range of $-1 \leq P \leq 0.1$, using the well layers in the thickness of not less than 2 nm and not more than 10 nm.

The III-nitride semiconductor laser 11 can further comprise an InGaN layer 27. The InGaN layer 27 is provided between the first cladding layer 15 and the active layer 17. The InGaN layer 27 acts as a buffer layer for controlling stress on the active layer 17. For example, the InGaN layer 27 is in contact with a primary surface of the first cladding layer 15, and the lattice constant of the first cladding layer 15 is different from that of the InGaN layer 27. The InGaN layer 27 is also in contact with the active layer 17, and the lattice constant of the well layers 23a of the active layer 17 is different from that of the InGaN layer 27.

Misfit dislocations are provided at an interface 29 between the first cladding layer 15 and the InGaN layer 27. The InGaN layer 27 is relaxed by introduction of misfit dislocations, thereby causing variation in anisotropy of strain in the active layer 17. This variation in strain is considered to allow for realization of the polarization degree P in the range of $-1 \leq P \leq 0.1$. The misfit dislocations are considered to be introduced because the c-plane of the InGaN layer acts as a slip plane. The misfit dislocations are introduced by use of the semiconductor substrate. Since a certain level of dislocation density is needed for causing change in anisotropy of strain, the density of misfit dislocations can be not less than $5 \times 10^3$ cm$^{-1}$. Since there is a possibility that a too high dislocation density deteriorates the crystal quality, the density of misfit dislocations can be not more than $1 \times 10^5$ cm$^{-1}$.

The indium composition X of the InGaN (In$_X$Ga$_{1-X}$N) layer 27 can be not less than 0.01. A certain level of In composition is needed for the introduction of misfit dislocations. The indium composition X can be not more than 0.1. A too high In composition could lead to deterioration of crystal quality of the active layer 17.

The thickness $D_{27}$ of the InGaN layer 27 can be not less than 20 nm. A certain level of film thickness is needed for the introduction of misfit dislocations. This thickness $D_{27}$ can be not more than 150 nm. A too large film thickness D could lead to deterioration of crystal quality of the active layer 17.

The III-nitride semiconductor laser 11 can further comprise a optical guide layer 31. The optical guide layer 31 is provided between the second cladding layer 19 and the active layer 17. The optical guide layer 31 comprises InGaN. When the optical guide layer 31 acts as a so-called upper optical guide layer, the InGaN layer 27 acts as a lower optical guide layer. These optical guide layers 27 and 31 define a beam pattern of the laser beam, and the optical guide layer 27 enables the introduction of misfit dislocations. An In composition of the optical guide layer 31 can be, for example, not less than 0.01 and not more than 0.1. The optical guide layer 27 can comprise undoped InGaN, and the optical guide layer 31 can comprise undoped InGaN.

The III-nitride semiconductor laser 11 further includes an electron block layer 33 provided between the second cladding layer 19 and the active layer 17. The bandgap of the electron block layer 33 is larger than that of the optical guide layer 31 and also larger than that of the second cladding layer 19. The electron block layer 33 comprises, for example, AlGaN.

The III-nitride semiconductor laser 11 further includes a contact layer 35 provided on the second cladding layer 19, if necessary. A dopant concentration of the contact layer 35 is larger than that of the second cladding layer 19. The contact layer 35 can comprise, for example, p-type GaN or the like.

The III-nitride semiconductor laser 11 can further include a pair of end faces 37a, 37b composed of cleaved planes. When the direction of inclination is defined as a direction with respect to the a-axis, it becomes possible to adopt cleaved planes extending along m-planes. The end faces 37a, 37b of the III-nitride semiconductor laser 11 use m-plane cleaved planes. A cavity of the III-nitride semiconductor laser 11 can be constructed using the m-plane cleaved planes. When the direction of inclination is defined as a direction with respect to the m-axis, it becomes possible to adopt cleaved planes extending along a-planes. The end faces 37a, 37b of the III-nitride semiconductor laser 11 use a-plane cleaved planes. A cavity of the III-nitride semiconductor laser 11 can be constructed using the a-plane cleaved planes. An angle between the end faces 37a, 37b and the axis Ax indicating the waveguide direction can be in the range of not less than −1 degrees and not more than +1 degrees.

When the primary surface 13a of the semiconductor substrate 13 is, for example, either one of the (11-22) plane (off angle of 58 degrees defined in association with the a-axis direction) and the (11-2-2) plane, inclination with respect to the a-axis direction becomes possible. When the primary surface 13a of the semiconductor substrate 13 is either one of the (10-11) plane (off angle of 62 degrees defined in association with the m-axis direction) and the (10-1-1) plane, inclination with respect to the m-axis direction becomes possible.

The III-nitride semiconductor laser further comprises a protecting film 41, which covers a surface of the p-type GaN semiconductor region 39a. A contact window 41a is provided in the protecting film 41 and extends in the waveguide direction. An electrode (e.g., an anode) 43a is in contact with the GaN semiconductor region 39a through the contact window 41a. On the other hand, an electrode (e.g., a cathode) 43b is in contact with the back surface 13b of the semiconductor substrate 13b. When a power supply is connected with the anode and the cathode, an electric current flows from the anode through the conductive semiconductor substrate to the cathode. The semiconductor substrate 13 can comprise, for example, electrically conductive GaN. GaN permits the substrate to have electric conductivity and enables provision of growth of an epitaxial film with excellent crystal quality. It is also possible to fabricate an off-angled GaN wafer.

Example 1

Figure 2:
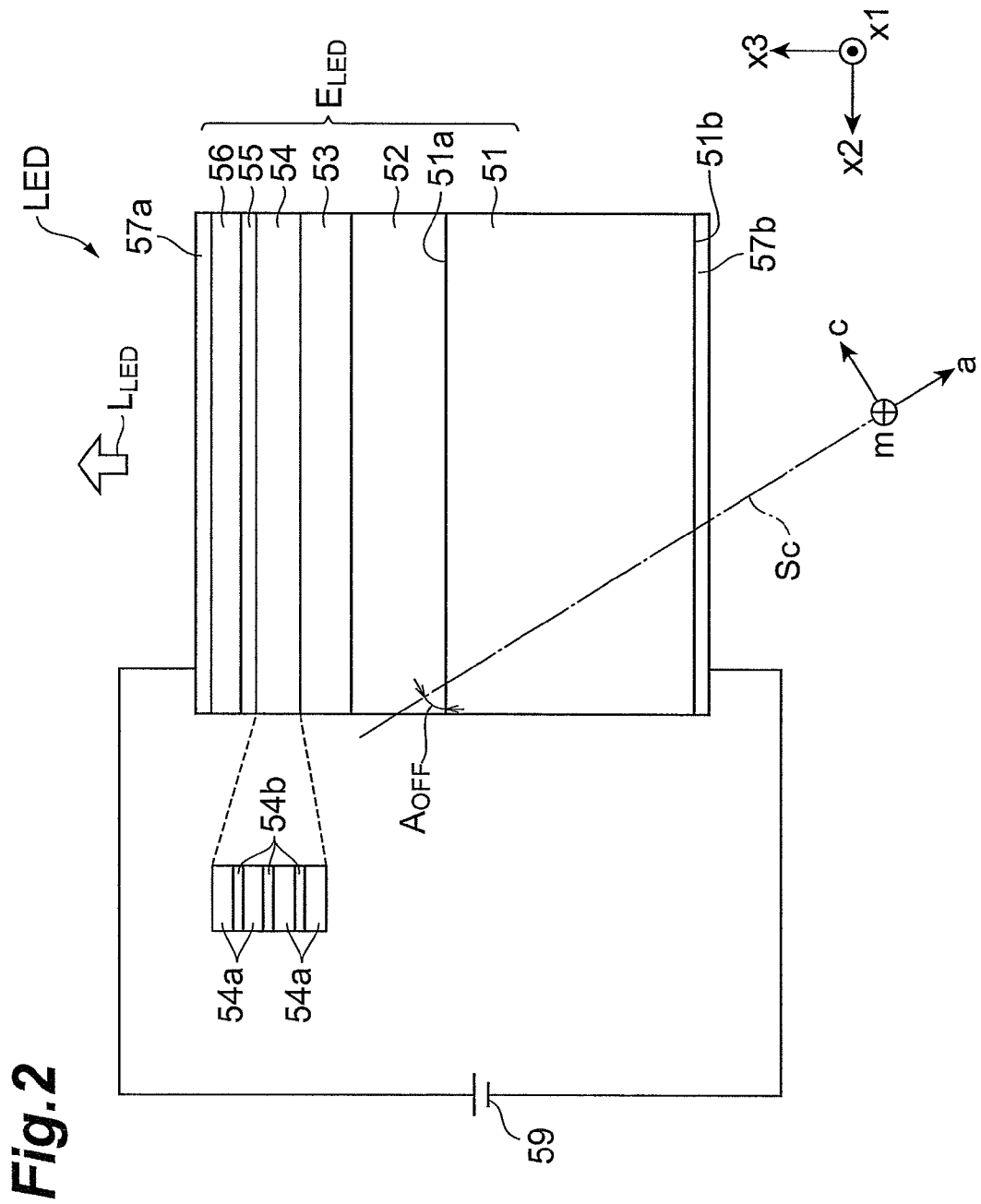
FIG. 2 is a drawing showing a structure of a light emitting diode in Example 1.

Semipolar GaN wafers with various off angles are prepared. The angles (off angles) between the c-plane and the wafer primary surface are, for example, 43 degrees defined as inclination to the m-axis direction, 58 degrees to the a-axis direction, 62 degrees to the m-axis direction, and 75 degrees to the m-axis method. A light emitting diode (LED) structure shown in FIG. 2 is fabricated on the GaN wafers. Epitaxial growth is carried out by organometallic vapor-phase epitaxy, and raw materials for the epitaxial growth used herein are as follows: trimethyl gallium (TMG); trimethyl indium (TMI); trimethyl aluminum (TMA); ammonia (NH$_3$); silane (SiH$_4$); and bis (cyclopentadienyl) magnesium (Cp$_2$Mg). Epitaxial wafers as shown in FIG. 2 are fabricated through the following steps.

The epitaxial growth is carried out under the following conditions on each of the GaN wafers. A maximum distance between two points on the edges of the GaN wafer is, for example, not less than 45 mm. First, the GaN wafer is placed on a susceptor of a growth reactor, for carrying out a preprocessing step. While NH$_3$ and H$_2$ are supplied to the growth reactor, a thermal treatment at the temperature of 1050 Celsius degrees is carried out as the preprocessing. The thermal treatment is carried out for, for example, 10 minutes. After this thermal treatment, the substrate temperature is changed, for example, to the temperature of 1150 Celsius degrees in order to carry out an n-type semiconductor growth step. TMG, NH$_3$, and SiH$_4$ were supplied at the substrate temperature of 1150 Celsius degrees to the growth reactor to grow a Si-doped GaN layer. The thickness of the GaN layer is, for example, 2 micrometers.

In the next step, growth of the following semiconductor layer is carried out in order to control the indium composition according to the off angle by use of the substrate temperature in the range of not less than 650 Celsius degrees and not more than 880 Celsius degrees. TMG, TMI, NH$_3$ and SiH$_4$ are supplied to the growth reactor to grow a Si-doped InGaN layer. The thickness of the InGaN layer is, for example, 100 nm. The In composition of the InGaN layer is, for example, 0.04.

The step of growing the active layer is carried out. First, a barrier layer growth step is carried out to grow an undoped GaN barrier layer while supplying TMG and NH$_3$ at a growth temperature ($T_B$) of the barrier layer to the growth reactor. The thickness of this GaN layer is 15 nm. After the growth of the GaN barrier layer, the growth is suspended, and the substrate temperature is changed from the growth temperature ($T_B$) to a growth temperature ($T_W$) of the well layer. After the change, a well layer growth step is carried out to grow an undoped InGaN well layer while supplying TMG, TMI, and NH$_3$ to the growth reactor. The thickness of the InGaN well layer is 3 nm. The In composition X of this In$_X$Ga$_{1-X}$N is, for example, 0.2. After the growth of the InGaN well layer, supply of TMI is stopped. Next, while supplying NH$_3$ to the growth reactor, the substrate temperature is changed from the growth temperature (T$_W$) to the growth temperature (T$_B$). After the change, the barrier layer growth step is carried out to grow an undoped GaN barrier layer. The thickness of the GaN barrier layer is 15 nm. A repetition step is carried out to repeat the growth of the well layer, the temperature change, and the growth of the barrier layer, thereby forming the InGaN well layers and GaN barrier layers.

In a p-type semiconductor growth step, a p-type GaN-based semiconductor region is grown on the active layer. For example, after the growth of the GaN barrier layer, supply of TMG is terminated and the substrate temperature is increased to 1000 Celsius degrees. At this temperature, TMG, TMA, NH$_3$ and Cp$_2$Mg are supplied to the growth reactor to grow a p-type Al$_{0.18}$Ga$_{0.82}$N electron block layer. This electron block layer is, for example, 20 nm. After this, supply of TMA is terminated and a p-type GaN contact layer is grown thereon. The p-type GaN contact layer is, for example, 50 nm. After the film formation, the temperature of the growth reactor is decreased to room temperature, resulting in obtaining an epitaxial wafer B$_{LED}$.

An electrode forming step is to form electrodes on the epitaxial wafer B$_{LED}$. First, a p-side electrode (transparent electrode Ni/Au) is formed on the p-type GaN contact layer. Thereafter, a p-pad electrode (Ti/Au) is formed. An n-side electrode (Ti/Al) is formed on the back surface of the GaN wafer. Thereafter, the electrodes are annealed (e.g., at 550 Celsius degrees for one minute). This step resulted in obtaining a substrate product of the semiconductor light emitting device.

FIG. 2 is a drawing showing a light emitting diode structure LED and a structure of an epitaxial wafer B$_{LED}$ for it. The light emitting diode structure LED, and the epitaxial wafer B$_{LED}$ include an n-type GaN semiconductor layer 52, an n-type InGaN layer 53, an active layer 54, a p-type electron block layer 55, and a p-type contact layer 56, which are grown in order on a primary surface 51$a$ of a GaN wafer 51. The active layer 54 includes barrier layers 54$a$ and well layers 54$b$. An anode 57$a$ is formed on the contact layer 56 of the epitaxial wafer B$_{LED}$, and a cathode 57$b$ is formed on a back surface 51$b$ of the GaN wafer.

Figure 3:
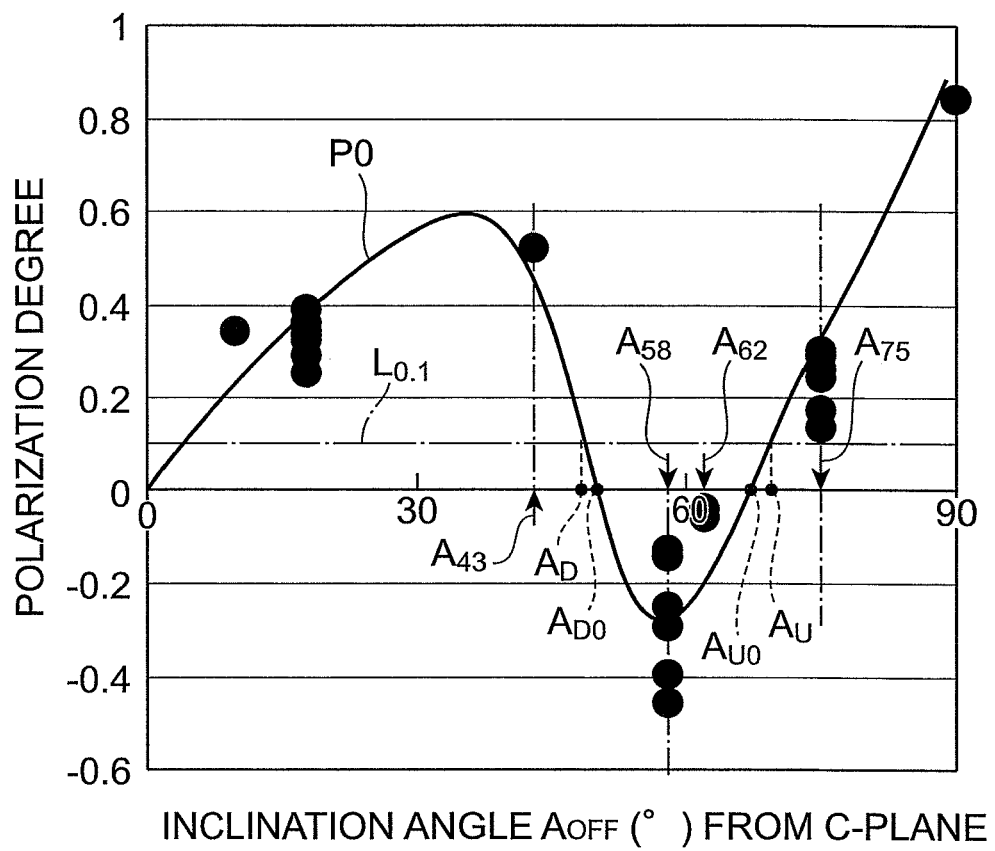
FIG. 3 is a drawing showing a relation of off angle versus polarization degree.

A power supply 59 is connected to these anode 57$a$ and cathode 57$b$ of the LED structure, and the polarization degree is measured for light L$_{LED}$ emitted through the contact layer 56 from the top surface of the LED structure. FIG. 3 is a drawing showing a relation of off angle versus polarization degree. With reference to FIG. 3, for example, 43 degrees defined as inclination with respect to the m-axis direction (arrow A$_{43}$), 58 degrees with respect to the a-axis direction (arrow A$_{58}$), 62 degrees with respect to the m-axis direction (arrow A$_{62}$), and 75 degrees with respect to the m-axis method (arrow A$_{75}$) are shown. A polarization degree characteristic curve P0 shows zero polarization at angles A$_{D0}$ and A$_{U0}$. FIG. 3 reveals that the angle A$_{D0}$ is approximately 50 degrees and that the angle A$_{U0}$ approximately 68 degrees. The polarization degree characteristic curve P0 shows the polarization degree of 0.1 at angles A$_D$ and A$_U$. FIG. 3 reveals again that the angle A$_D$ is approximately 49 degrees and that the angle A$_U$ approximately 73 degrees. As shown in FIG. 3, the polarization degree characteristic curve P0 once increases in the positive polarization degree region with increase in the inclination angle A$_{OFF}$ from the c-plane. After the inclination angle exceeds 30 degrees, the polarization degree characteristic curve P0, however, decreases with increase in the inclination angle A$_{OFF}$, reaches the polarization degree of not more than 0.1 around the angle A$_D$, and then becomes negative around the angle A$_{D0}$. Thereafter, it takes a minimum value at the inclination angle of about 60 degrees, then increases with increase in the inclination angle A$_{OFF}$, becomes positive around the angle A$_{U0}$, exceeds the polarization degree of 0.1 around the angle A$_U$, and further increases.

Figure 4:
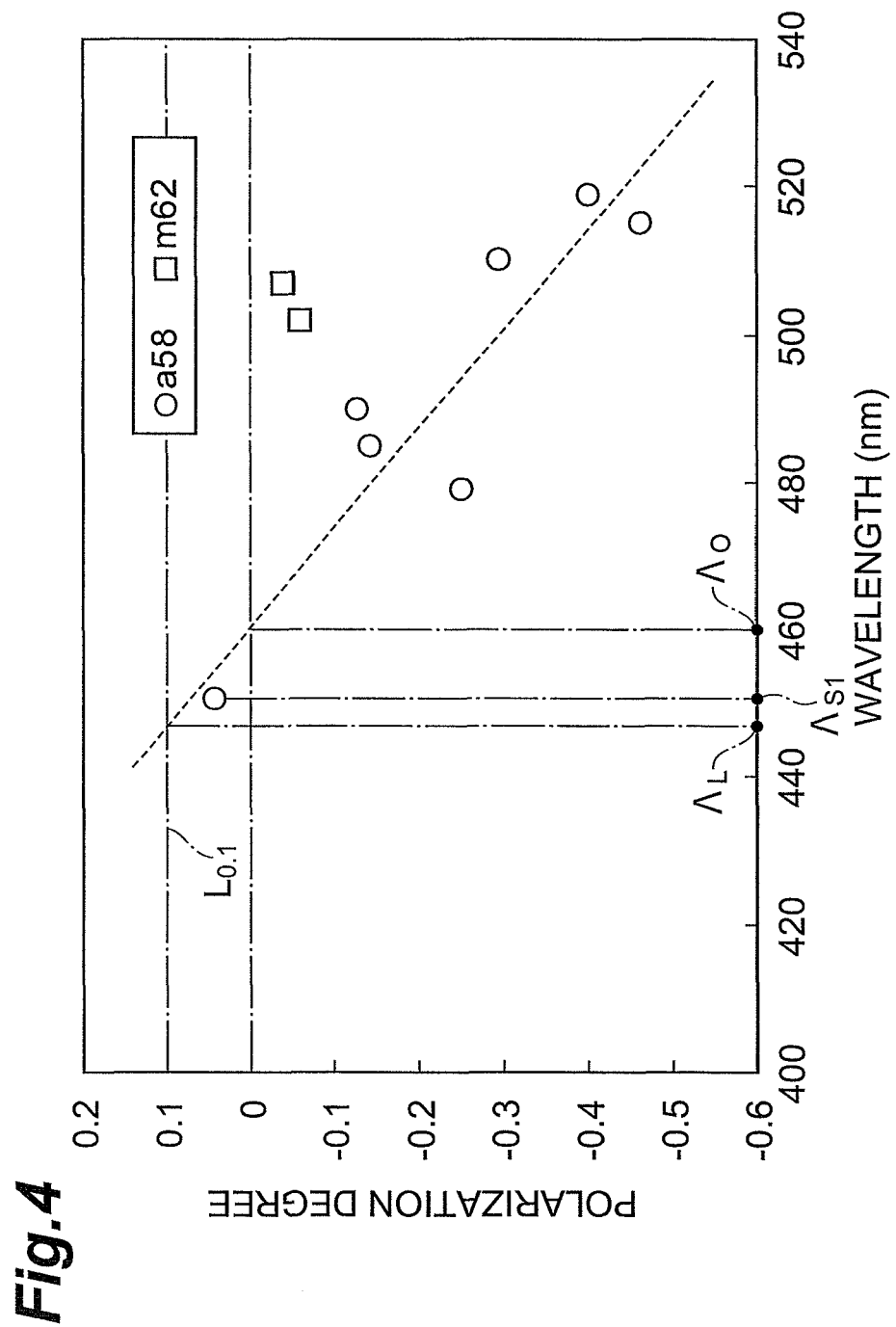
FIG. 4 is a drawing showing a relation of peak emission wavelength versus polarization degree in the LED mode, with typical inclination angles $A_{OFF}$ (inclination of 58 degrees with respect to the a-axis direction and inclination of 62 degrees with respect to the m-axis direction).

FIG. 4 is a drawing showing a relation of peak emission wavelength versus polarization degree in the LED mode, with the typical inclination angles A$_{OFF}$ of 58 degrees (inclination with respect to the a-axis direction) and 62 degrees (inclination with respect to the m-axis direction). With reference to FIG. 4, the polarization degree demonstrates 0.1 at a wavelength Λ$_L$ near the wavelength of 450 nm. The polarization degree becomes zero at a wavelength Λ$_0$ near 460 nm. A wavelength Λ$_{S1}$ is 450 nm.

In this LED structure, the polarization degree P demonstrates wavelength dependence. Based on this experiment and other experiments by the inventors, the polarization degree P can be realized in the range of $-1 \leq P \leq 0.1$, in the range of peak lasing wavelength of not less than 450 nm and not more than 550 nm.

For achieving the polarization degree of a negative value, the peak lasing wavelength of the multiple quantum well structure can be not less than 460 nm and not more than 550 nm. This semiconductor laser allows for realization of a low threshold. For example, with the inclination angles in the range of not less than 58 degrees and not more than 62 degrees, the polarization degree P is negative.

FIG. 5 is a drawing showing cathodoluminescence (CL) images of LED structures. FIG. 5 ($a$) to FIG. 5 ($d$) show CL images of the respective LED structures with the off angle of 43 degrees with respect to the m-axis direction (polarization degree: 0.52), with the off angle of 58 degrees with respect to the a-axis direction (polarization degree: −0.29), with the off angle of 62 degrees with respect to the m-axis direction (polarization degree: −0.06), and with the off angle of 75 degrees with respect to the m-axis direction (polarization degree: 0.24). The acceleration voltage in measurement of the CL images was set so as to allow accelerated electrons to reach the InGaN layer. In the CL images with the off angle of 58 degrees with respect to the axis direction and, with the off angle of 62 degrees with respect to the m-axis direction showing the negative polarization degrees, dark lines were observed in the direction perpendicular to the off direction. Judging from the direction of the dark lines, it is considered that misfit dislocations are introduced while the c-plane acts as a slip plane. In a semipolar GaN substrate, a dislocation half-loop spreads on a plane inclined relative to a semipolar plane (or on a slip plane), whereby misfit dislocations are introduced at the position where the slip plane and the interface intersect (in the foregoing LED structure, the interface between the InGaN layer and the n-type GaN layer).

As shown in FIG. 4, the polarization degree P decreases with increase in the emission peak wavelength. This behavior of polarization degree P can be explained as follows by increase in In composition of the well layers. The well layers with large In compositions are considered to have a strong quantum confinement effect. The results of FIG. 5 can also be explained by the increase in In composition of the well layers. Since the well layers with large In compositions impart significant stress to the interface between the InGaN layer and the n-type GaN layer, misfit dislocations are considered to be likely to occur at this interface.

It is considered from the results of FIGS. 3 to 5 that significant shear stress acts on the c-plane in the off angle range of 50 degrees to 70 degrees and that misfit dislocations are introduced to the interface between the InGaN layer and the underlying GaN layer. It is considered that the introduction of misfit dislocations varies in-plane anisotropy of strain of the well layers so as to affect the polarization degree.

Figure 6:
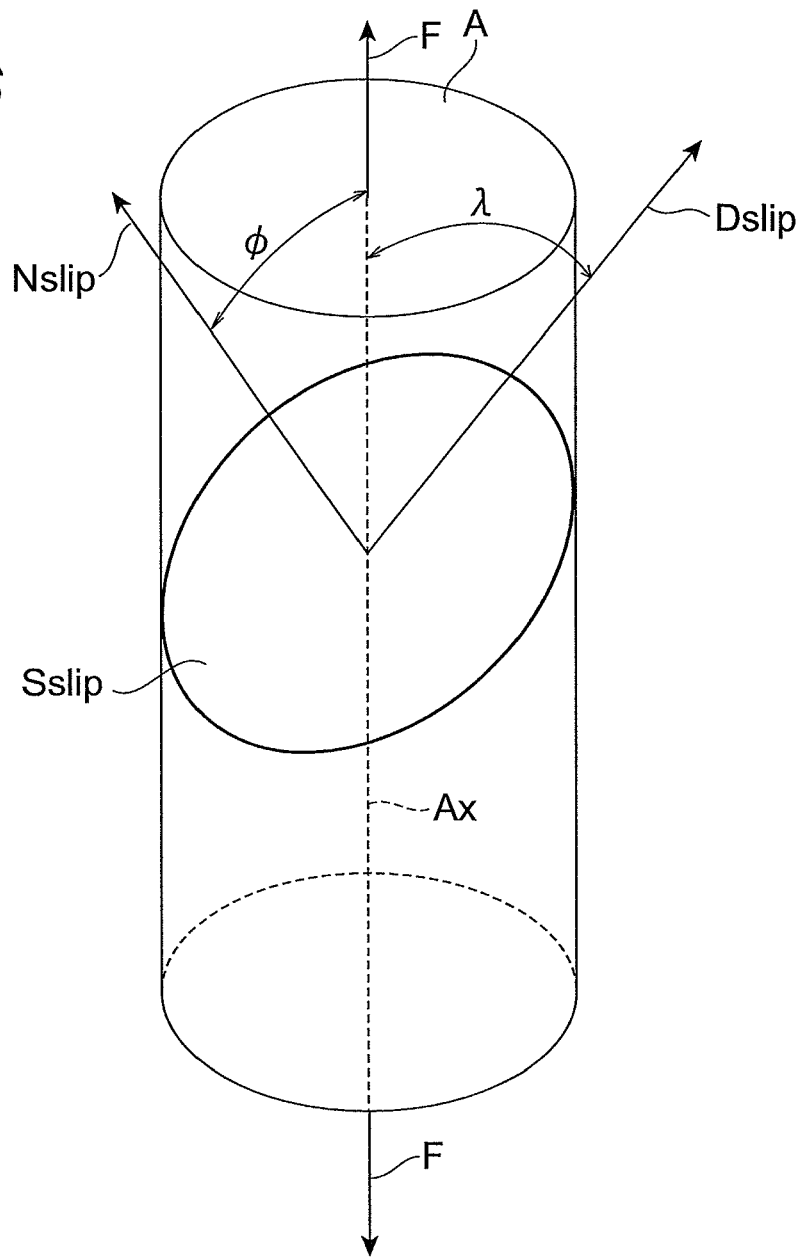
FIG. 6 is a drawing for explaining the Schmid factor.

Let us estimate the Schmid factor of the c-plane when the c-plane is the slip plane. This Schmid factor indicates a degree of occurrence of a slip on the c-plane. The Schmid factor will be described with reference to FIG. 6. In FIG. 6, a part of the InGaN layer is shown as an object of a cylindrical shape. The c-plane slip plane $S_{slip}$ is inclined relative to the axis Ax to a direction indicated by normal vector $N_{slip}$. The c-plane slip plane $S_{slip}$ slips in a direction indicated by slip vector $D_{slip}$ (the direction of the c-axis). When a tensile force F is applied to a cross-sectional area A, the shear stress τ in the slip direction is represented by the following equation.

$$\tau = (F \times \cos \lambda)/(A/\cos \phi) = \sigma \times \cos \lambda \times \cos \phi \quad (1)$$

When the stress σ(=F/A) is not less than a critical value, deformation occurs at the slip plane. "cos λ·cos φ" in Eq (1) is called the Schmid factor (which will be represented by "$F_S$" below).

Figure 7:
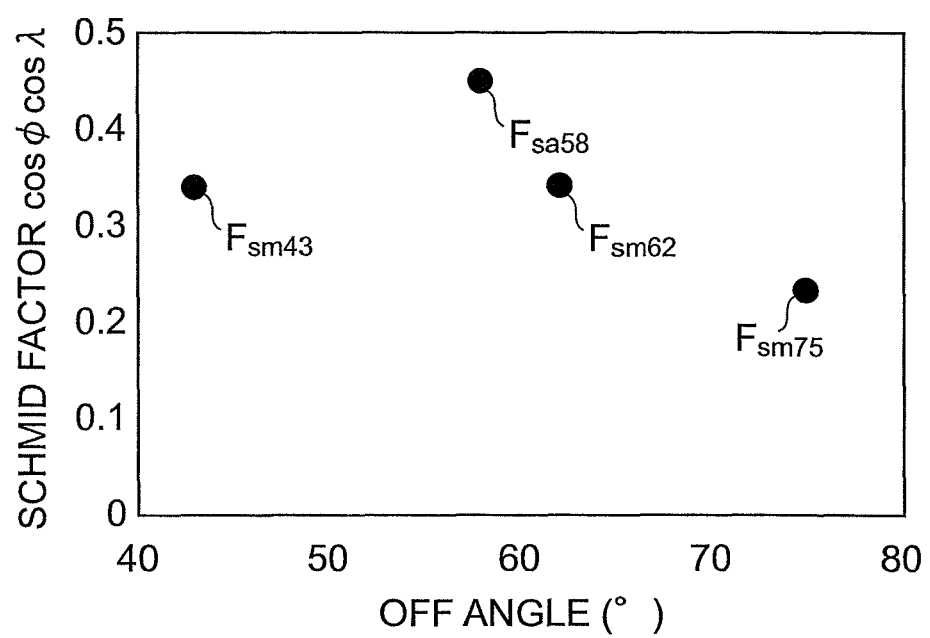
FIG. 7 is a drawing showing a relation of off angle versus Schmid factor.

FIG. 7 is a drawing showing a relation of off angle versus Schmid factor. Magnitudes of the Schmid factor are given in the following order.

$$F_{Sa58} F_{Sm62} > F_{Sm43} > F_{Sm75} \quad (2)$$

The order represented by Formula (2) qualitatively supports the relation of off angles with occurrence of the dark lines in the CL images. In the CL images, misfit dislocations are observed in the LED structure on the GaN substrate with 58 degrees with respect to the a-axis direction and in the LED structure on the GaN substrate with 62 degrees with respect to the m-axis direction. Boundaries of occurrence of misfit dislocations are angles of not more than 50 degrees and near 50 degrees and angles of not less than 70 degrees and near 70 degrees.

Example 2

Figure 8:
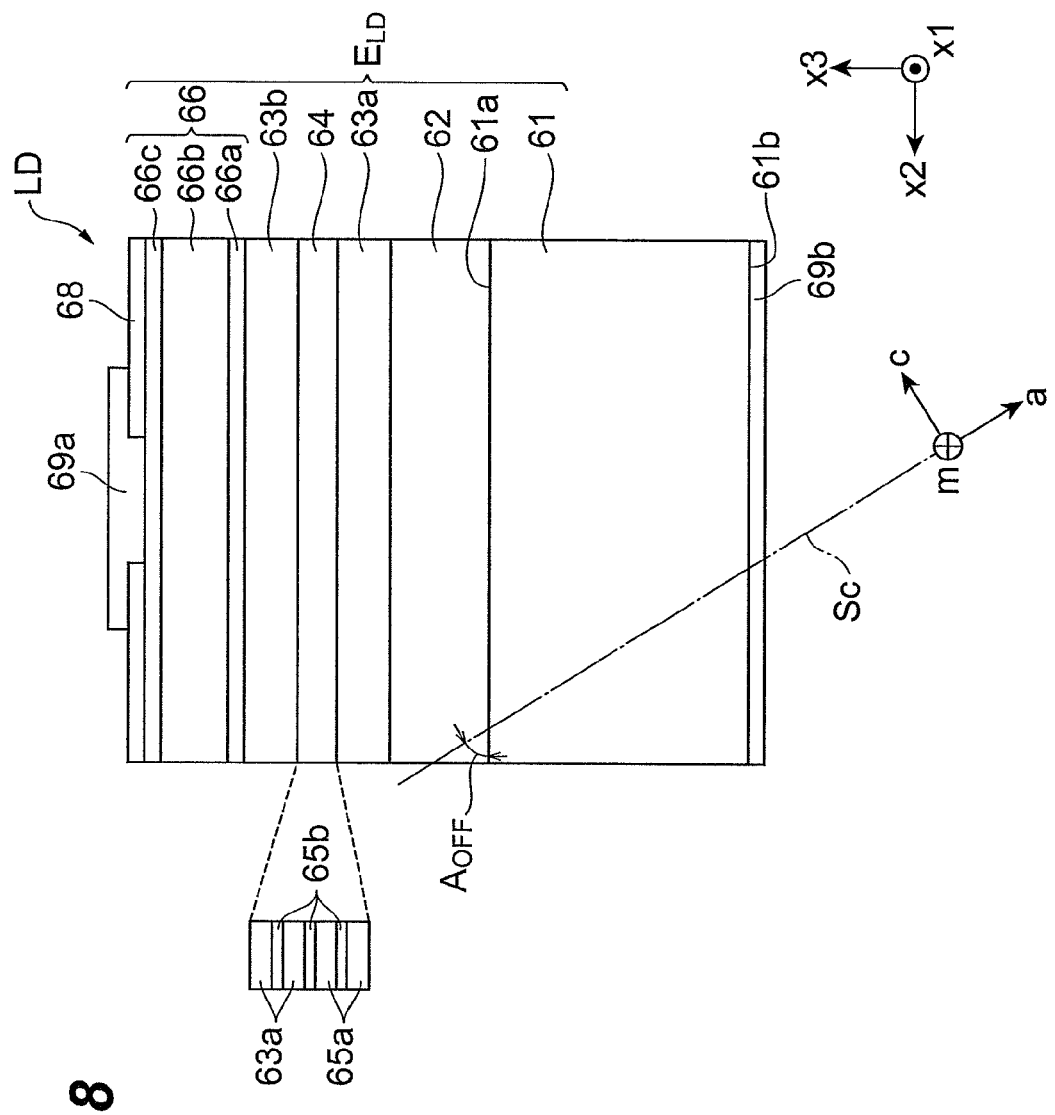
FIG. 8 is a drawing showing an epitaxial wafer and a structure of a semiconductor laser in Example 2.
Figure 9:
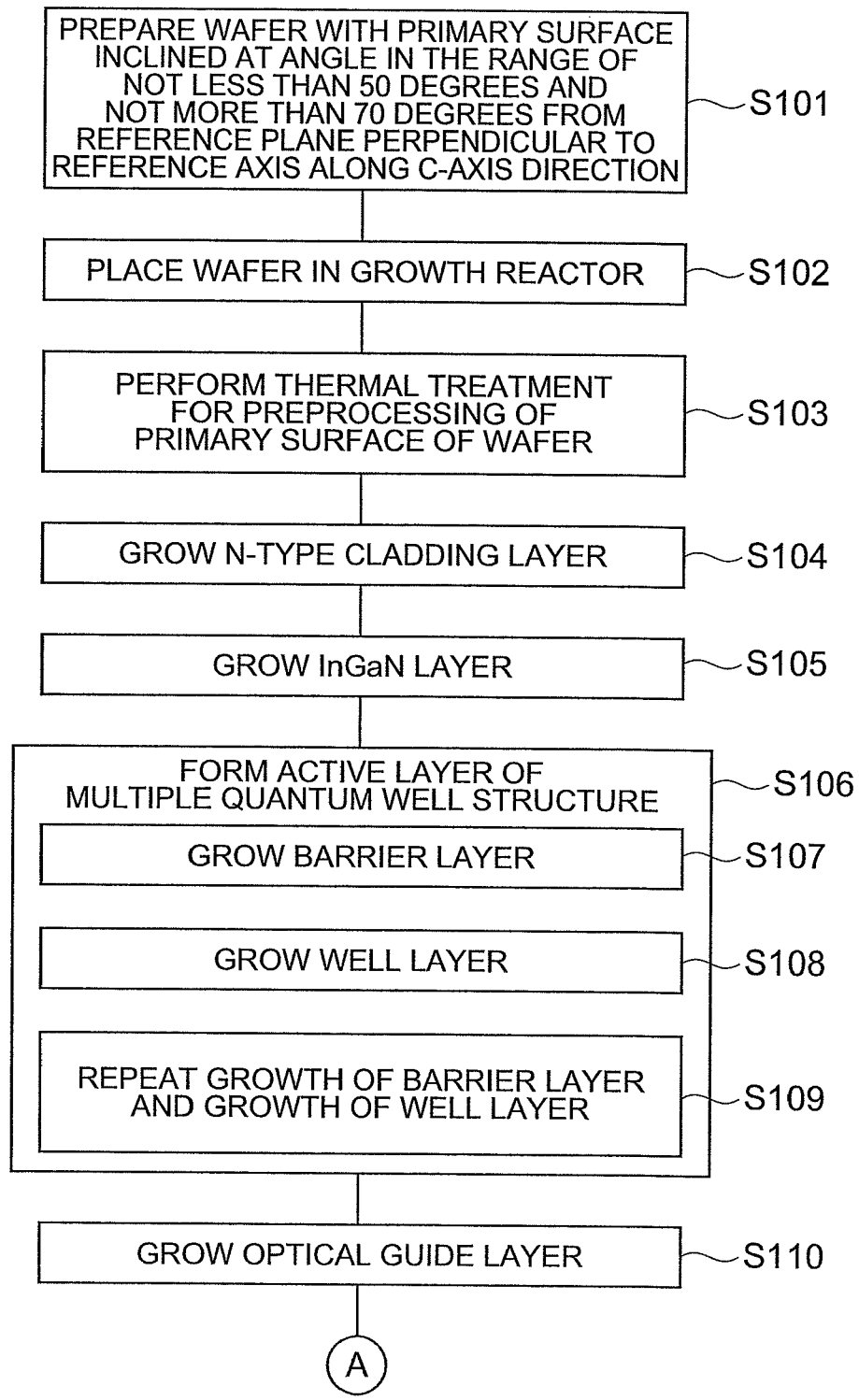
FIG. 9 is a drawing showing major steps in a method of fabricating the epitaxial wafer and semiconductor laser in Example 2.
Figure 10:
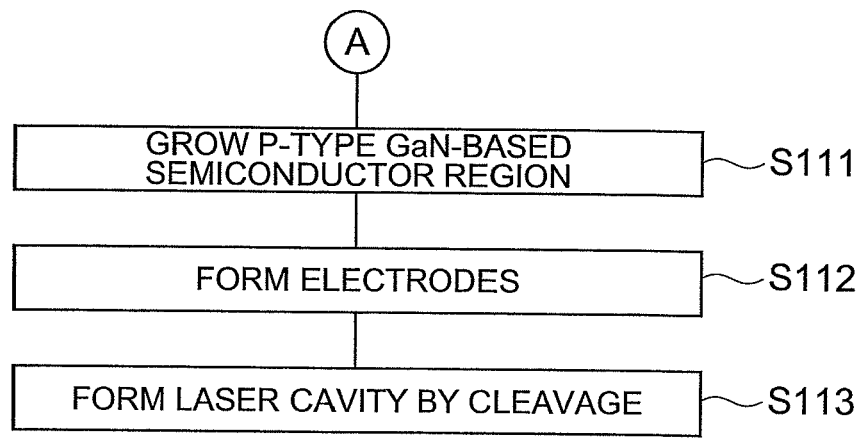
FIG. 10 is a drawing showing major steps in the method of fabricating the epitaxial wafer and semiconductor laser in Example 2.

In Example 1, the relation of polarization degree versus angle was found by observation of emissions from the LED structures. In Example 2, a semiconductor laser structure was made on a GaN wafer inclined at 58 degrees with respect to the a-axis direction. The epitaxial growth was carried out by organometallic vapor-phase epitaxy and raw materials for the epitaxial growth used herein were trimethyl gallium (TMG), trimethyl indium (TMI), trimethyl aluminum (TMA), ammonia ($NH_3$), silane ($SiH_4$), and bis(cyclopentadienyl) magnesium ($Cp_2Mg$). Fabrication of the epitaxial wafer and semiconductor laser shown in FIG. 8 by the following steps will be described with reference to FIGS. 9 and 10.

Step S101 was to prepare a semipolar GaN wafer with the angle of inclination in the range of not less than 50 degrees and not more than 70 degrees. In Example 2, a GaN wafer 61 inclined at 58 degrees with respect to the a-axis direction was prepared.

The epitaxial growth was carried out under the following conditions on the GaN wafer 61. First, step S102 was to place the GaN wafer 61 on a susceptor of a growth reactor. Step S103 was to carry out a thermal treatment at the temperature of 1050 Celsius degrees while supplying $NH_3$ and $H_2$ to the growth reactor, in order to carry out preprocessing. The time of the thermal treatment was, for example, 10 minutes. After this thermal treatment, step S104 was carried out to change the substrate temperature, for example, to the temperature of 1150 Celsius degrees, in order to carry out growth of an n-type semiconductor. TMG, TMA, $NH_3$, and $SiH_4$ were supplied at the substrate temperature of 1150 Celsius degrees to the growth reactor, thereby growing a Si-doped AlGaN layer 62 on a primary surface 61a of the GaN wafer 61. The thickness of this AlGaN layer 62 is, for example, 2 micrometers. An Al composition of the AlGaN layer 62 is, for example, 0.04.

Next step S105 was to grow an InGaN layer 63a on the AlGaN layer 62 while supplying TMG, TMI, and $NH_3$ at the substrate temperature of 840 Celsius degrees to the growth reactor. The thickness of the InGaN layer 63a is, for example, 100 nm and the In composition thereof, for example, 0.04. This InGaN layer 63a also functions as a optical guide layer.

Step S106 was carried out to grow an active layer 64. First, a barrier layer growth step S107 was carried out to grow an undoped GaN barrier layer 65a while supplying TMG and $NH_3$ at the growth temperature ($T_B$) of 860 Celsius degrees to the growth reactor. The thickness of this GaN layer 65a is, for example, 15 nm. After change of temperature, a well layer growth step S108 was carried out to grow an undoped InGaN well layer 65b on the GaN barrier layer 65a while supplying TMG, TMI, and $NH_3$ at the growth temperature ($T_W$) of 790 Celsius degrees to the growth reactor. The thickness of the InGaN well layer 65b was, for example, 3 nm. The In composition X of this $In_XGa_{1-X}N$ was, for example, 0.18. The In composition X can be, for example, in the range of not less than 0.10 and not more than 0.40. After the growth of the InGaN well layer 65b, the substrate temperature was changed from the growth temperature ($T_W$) to the growth temperature ($T_B$). After the change, the barrier layer growth step S107 was carried out to grow an undoped GaN barrier layer 65a. The thickness of the GaN barrier layer 65a is, for example, 15 nm. A repetition step S109 was carried out to repeat the growth of the well layer 65b, the temperature change, and the growth of the barrier layer 65a, thereby forming the multiple quantum well structure including the GaN barrier layers 65a and InGaN well layers 65b arranged alternately.

Next step S110 was to grow an InGaN layer 63b on the active layer 64 while supplying TMG, TMI, and $NH_3$ at the substrate temperature of 840 Celsius degrees to the growth reactor. The thickness of the InGaN layer is, for example, 100 nm and the In composition thereof, for example, 0.04.

A p-type semiconductor growth step S111 was to grow a p-type GaN-based semiconductor region 66 on the InGaN layer 63b. For example, after the growth of the InGaN optical guide layer 63b, supply of TMG was terminated and the substrate temperature was raised to 1000 Celsius degrees. At this temperature, TMG, TMA, $NH_3$, and $Cp_2Mg$ were supplied to the growth reactor to grow a p-type AlGaN electron block layer 66a on the InGaN optical guide layer 63b. This electron block layer 66a was, for example, 20 nm. The Al composition of the electron block layer 66a was, for example, 0.18. Then, without change in temperature, TMG, TMA, $NH_3$, and $Cp_2Mg$ were supplied to the growth reactor to grow a p-type AlGaN cladding layer 66b on the electron block layer 66a. This p-type cladding layer 66b was, for example, 400 nm. The Al composition of the p-type cladding layer 66b was, for example, 0.04. After this, the supply of TMA was terminated and a p-type GaN contact layer 66c was grown on the p-type cladding layer 66b. The p-type GaN contact layer 66c was, for example, 50 nm. After the film formation, the temperature of the growth reactor was decreased to room temperature, thereby fabricating an epitaxial wafer $E_{LD}$.

An electrode forming step S112 is to form an insulating film 68 with a contact window on the epitaxial wafer $E_{LD}$ and thereafter to form a p-side electrode 69a and an n-side electrode 69b on the epitaxial wafer $E_{LD}$. A p-side transparent electrode (Ni/Au) is formed on the p-type GaN contact layer 66c. After this, an anode pad electrode (Ti/Au) is formed. The insulating film is, for example, a silicon oxide film.

The contact window is, for example, a stripe shape with the width of 10 μm. A cathode electrode (Ti/Al) is formed on a back surface 61b of the GaN wafer 61. After this, the electrodes are annealed (for example, at 55 Celsius degrees for one minute). A substrate product of semiconductor light emitting device was obtained through these steps.

A cleavage step S113 was carried out to cleave the substrate product with a predetermined space, thereby making a laser cavity. The cleavage causes, for example, the laser cavity to include a pair of m-plane cleaved faces. A semiconductor laser $D_M$ was fabricated through these steps.

For a comparison's sake, the same laser structure was also made on a c-plane GaN wafer by epitaxial growth. A semiconductor laser $D_C$ was fabricated.

FIG. 11 is a drawing showing characteristics of the semiconductor lasers $D_M$ and $D_C$. FIG. 11 (a) shows a relation of injected current density versus peak wavelength of emission spectra in the LED mode. FIG. 11 (b) shows a relation of injected current density versus half maximum full-width of emission spectra in the LED mode.

Since the semiconductor laser $D_M$ is made on a semipolar plane (plane inclined at 58 degrees with respect to the a-axis direction), a blue shift of the semiconductor laser $D_M$ is smaller than that of the semiconductor laser $D_C$. The half maximum full-width of the semiconductor laser $D_M$ is also smaller than that of the semiconductor laser $D_C$. The behavior of the half maximum full-width can be understood as follows. Since the semiconductor laser $D_C$ demonstrates the significant piezoelectric effect, carrier densities in the respective well layers of the active layer differ according to an amount of injected current into the active layer. The difference of carrier densities causes a difference in levels of piezoelectric screening in the respective well layers. For this reason, the half maximum full-width becomes larger in the emission spectrum in the LED mode. On the other hand, the piezoelectric polarization of the semiconductor laser $D_M$ is smaller than that of the semiconductor laser $D_C$, and therefore the difference in levels of piezoelectric screening in the respective well layers is small. In addition, the well layers of the semiconductor laser $D_M$ demonstrate less non-uniformity of In composition than those of the semiconductor laser $D_C$. This uniformity of In composition also contributes to reduction in half maximum full-width in the emission spectrum in the LED mode.

The semiconductor laser $D_M$ showed the polarization degree of +0.02 when measured with the injected current of 5 mA. This polarization degree is smaller than those in hitherto reported examples. When the applied current to the semiconductor lasers $D_M$ and $D_C$ was increased, the semiconductor laser $D_M$ lased at the current of 850 mA. On the other hand, the semiconductor laser $D_C$ lased at the current of 900 mA.

As described above, the semiconductor lasers were obtained with the very small polarization degree (not more than 0.1 and not less than −1). It is considered that the lower threshold than in the comparative example was achieved using the end face mirrors by m-plane cleavage.

The principle of the present invention has been illustrated and explained in the preferred embodiments, but it is recognized by those skilled in the art that the present invention can be modified in arrangement and detail without departing from the principle. The present invention is by no means limited to the specific configurations disclosed in the embodiments. Therefore, the applicant claims all modifications and changes falling within the scope of claims and coming from the scope of spirit thereof.

LIST OF REFERENCE SYMBOLS

11 . . . III-nitride semiconductor laser;
13 . . . semiconductor substrate;
15 . . . first cladding layer;
17 . . . active layer;
19 . . . second cladding layer;
13a . . . primary surface of semiconductor substrate;
13b . . . back surface of semiconductor substrate;
22 . . . multiple quantum well structure;
23a . . . well layers;
23b . . . barrier layers;
P . . . polarization degree;
27 . . . InGaN layer;
29 . . . interface;
31 . . . optical guide layer;
33 . . . electron block layer;
35 . . . contact layer;
37a, 37b . . . end faces;
39a . . . p-type gallium nitride semiconductor region;
41a . . . contact window;
43a, 43b . . . electrodes;
LED . . . light emitting diode structure;
$E_{LED}$ . . . epitaxial wafer;
51 . . . GaN wafer;
52 . . . n-type GaN semiconductor layer;
53 . . . n-type InGaN layer;
54 . . . active layer;
55 . . . p-type electron block layer;
56 . . . p-type contact layer;
54a . . . barrier layers;
54b . . . well layers;
61 . . . GaN wafer;
62 . . . Si-doped AlGaN layer;
63a . . . InGaN layer;
63b . . . InGaN layer;
64 . . . active layer;
65a . . . undoped GaN barrier layers;
65b . . . undoped InGaN well layers;
66 . . . p-type GaN-based semiconductor region;
66a . . . p-type AlGaN electron block layer;
66b . . . p-type AlGaN cladding layer;
66c . . . p-type GaN contact layer;
$E_{LD}$ . . . epitaxial wafer; 68 insulating film;
69a . . . p-side electrode;
69b . . . n-side electrode.

The invention claimed is:

1. A III-nitride semiconductor laser, comprising: a semiconductor substrate comprising a hexagonal III-nitride semiconductor, the semiconductor substrate having a primary surface, the primary surface being inclined at an angle of inclination in a range of not less than 50 degrees and not more than 70 degrees toward either one of an a-axis direction and an m-axis direction of the III-nitride semiconductor with respect to a reference plane perpendicular to a reference axis, and the reference axis extending along a c-axis direction of the III-nitride semiconductor; a first cladding layer provided on the primary surface of the semiconductor substrate, the first cladding layer comprising a first conductivity type gallium nitride-based semiconductor; a second cladding layer provided on the primary surface of the semiconductor substrate, the second cladding layer comprising a second conductivity type gallium nitride-based semiconductor; an active layer provided between the first cladding layer and the second cladding layer, and an InGaN layer provided between the first cladding layer and the active layer, misfit dislocations being provided at an interface between the first cladding layer and the InGaN layer, wherein the misfit dislocations relax the InGaN layer and create variation in anisotropy of strain in the active layer, a waveguide direction in the active layer being directed along another of the a-axis direction and the m-axis direction, in an orthogonal coordinate system having an X1 axis direction along the waveguide direction, an X2 axis perpendicular to the X1 axis and an X3 axis perpendicular to the X1 axis and the X2 axis, the first cladding layer, the active layer, and the second cladding layer being arranged in a direction of the X3 axis, the active layer having a multiple quantum well structure, the multiple quantum well structure comprising well layers and barrier layers, the well layers and barrier layers being arranged alternately in the direction of the X3 axis, the well layers comprising InGaN, and the barrier layers comprising GaN, the multiple quantum well structure being provided such that at least either of thickness of the well layers and bandgap energy difference between the well layers and the barrier layers enables a polarization degree P in an LED mode of the III-nitride semiconductor laser to fall within a range of not less than −1 and not more than 0.1, and the polarization degree P being defined as follows: $P=(|1|-|1|)/(|1|+|2|)$, where $|1|$ indicates an electric field component of light in the LED mode in the X1 direction and $|2|$ indicates an electric field component of light in the LED mode in the X2 direction, wherein the thickness of the well layers is not less than 2 nm and not more than 10 nm, and an indium composition of the well layers is not less than 0.1 and not more than 0.4.

2. The III-nitride semiconductor laser according to claim 1, wherein a lasing wavelength of the multiple quantum well structure of the active layer is not less than 450 nm and not more than 550 nm.

3. The III-nitride semiconductor laser according to claim 1, wherein the misfit dislocations are introduced by action of a slip plane of c-plane.

4. The III-nitride semiconductor laser according to claim 1, wherein the misfit dislocations are observed in a cathodoluminescence image thereof.

5. The III-nitride semiconductor laser according to claim 1, wherein a density of the misfit dislocations is not less than $5\times10^3$ cm$^{-1}$ and not more than $1\times10^5$ cm$^{-1}$.

6. The III-nitride semiconductor laser according to claim 1, wherein an indium composition of the InGaN layer is not less than 0.01,
wherein the indium composition of the InGaN layer is not more than 0.1,
wherein the InGaN layer is in contact with a primary surface of the first cladding layer, and
wherein a lattice constant of the first cladding layer is different from a lattice constant of the InGaN layer.

7. The III-nitride semiconductor laser according to claim 1, wherein thickness of the InGaN layer is not less than 20 nm, and
wherein the thickness of the InGaN layer is not more than 150 nm.

8. The III-nitride semiconductor laser according to claim 1, wherein the InGaN layer is in a first optical guide layer,
the III-nitride semiconductor laser further comprising a second optical guide layer provided between the second cladding layer and the active layer,
wherein the second optical guide layer comprises InGaN.

9. The III-nitride semiconductor laser according to claim 1, wherein the polarization degree P is a negative value.

10. The III-nitride semiconductor laser according to claim 1, wherein the semiconductor substrate comprises GaN.

11. The III-nitride semiconductor laser according to claim 1, wherein a direction of the inclination is a direction of the a-axis,
the III-nitride semiconductor laser further comprising a pair of end faces, the end faces comprising m-cleaved faces of the hexagonal III-nitride.

12. The III-nitride semiconductor laser according to claim 1, wherein the primary surface of the semiconductor substrate includes either one of the (11-22) plane and the (11-2-2) plane.

13. The III-nitride semiconductor laser according to claim 1, wherein a direction of the inclination is a direction of the m-axis,
the III-nitride semiconductor laser further comprising a pair of end faces, the end faces comprising a-cleaved faces of the hexagonal III-nitride.

14. The III-nitride semiconductor laser according to claim 1, wherein the primary surface of the semiconductor substrate includes either one of the (10-11) plane and the (10-1-1) plane.

15. A method for fabricating a III-nitride semiconductor laser, comprising the steps of: preparing a semiconductor wafer, the semiconductor wafer comprising a hexagonal III-nitride semiconductor and having a primary surface, the primary surface being inclined at an angle of inclination in a range of not less than 50 degrees and not more than 70 degrees towards either one of an a-axis direction and an m-axis direction of the hexagonal III-nitride semiconductor with respect to a reference plane perpendicular to a reference axis, and the reference axis extending along the c-axis direction of the III-nitride semiconductor; growing a first cladding layer of a first conductivity type gallium nitride-based semiconductor on the primary surface of the semiconductor wafer; growing an InGaN layer on the first cladding layer; growing an active layer on the InGaN layer; and growing a second cladding layer of a second conductivity type gallium nitride-based semiconductor on the active layer, misfit dislocations being formed at an interface between the first cladding layer and the InGaN layer, wherein the misfit dislocations relax the InGaN layer and create variation in anisotropy of strain in the active layer, a waveguide direction in the active layer being directed along either one of the a-axis direction and the m-axis direction, in an orthogonal coordinate system having an X1 axis directed along the waveguide direction, an X2 axis perpendicular to the X1 axis and an X3 axis perpendicular to the X1 axis and the X2 axis, the first cladding layer, the active layer and the second cladding layer being arranged in a direction of the X3 axis, the active layer having a multiple quantum well structure, the multiple quantum well structure comprising well layers and barrier layers, the well layers and barrier layers being arranged alternately in the direction of the X3 axis, the well layers comprising InGaN, and the barrier layers comprising GaN, the multiple quantum well structure being provided such that at least either of thickness of the well layers and bandgap energy difference between the well layers and the barrier layers enables a polarization degree P in the LED mode of the III-nitride semiconductor laser to fall within a range of not less than −1 and not more than 0.1, and the polarization degree P being defined as follows: $P=(|1|-|2|)/(|1|+|2|)$, where $|1|$ indicates an electric field component of light in the LED mode in the X1 direction and $|2|$ indicates an electric field component of light in the LED mode in the X2 direction, wherein the thickness of the well layers not less than 2 nm and not more than 10 nm, and an indium composition of the well layers is not less than 0.1 and not more than 0.4.

16. The method according to claim 15, wherein the misfit dislocations are introduced by action of a slip plane of c-plane.

17. The method according to claim 15, wherein a density of the misfit dislocations is not less than $5\times10^3$ cm$^{-1}$ and not more than $1\times10^5$ cm$^{-1}$.

18. The method according to claim 15, wherein an indium composition of the InGaN layer is not less than 0.01,
    wherein the indium composition of the InGaN layer is not more than 0.1,
    wherein the InGaN layer is in contact with a primary surface of the first cladding layer, and
    wherein a lattice constant of the first cladding layer is different from a lattice constant of the InGaN layer.

19. The method according to claim 15, wherein a thickness of the InGaN layer is not less than 20 nm, and wherein the thickness of the InGaN layer is not more than 150 nm.

* * * * *

UNITED STATES PATENT AND TRADEMARK OFFICE
CERTIFICATE OF CORRECTION

PATENT NO. : 8,548,021 B2  
APPLICATION NO. : 13/211858  
DATED : October 1, 2013  
INVENTOR(S) : Fujii et al.

Page 1 of 1

It is certified that error appears in the above-identified patent and that said Letters Patent is hereby corrected as shown below:

In the Claims:

Column 17, claim 1, lines 21-22, "$P=(|1-|1)/(|1+|2)$" should be --$P=(I1-I2)/(I1+I2)$--.

Column 18, claim 15, lines 59-60, "$P=(|1-|2)/(|1+|2)$" should be --$P=(I1-I2)/(I1+I2)$--.

Signed and Sealed this  
Eighteenth Day of February, 2014

Michelle K. Lee  
*Deputy Director of the United States Patent and Trademark Office*